(12) United States Patent
Vohra et al.

(10) Patent No.: US 7,945,417 B2
(45) Date of Patent: May 17, 2011

(54) METHOD OF DIGITAL EXTRACTION FOR ACCURATE FAILURE DIAGNOSIS

(75) Inventors: Fazela M. Vohra, Sunnyvale, CA (US); Carl Z. Zhou, Plano, TX (US)

(73) Assignee: Carl Z. Zhou, Plano, TX (US)

( * ) Notice: Subject to any disclaimer, the term of this patent is extended or adjusted under 35 U.S.C. 154(b) by 462 days.

(21) Appl. No.: 11/968,997

(22) Filed: Jan. 3, 2008

(65) Prior Publication Data

US 2009/0033335 A1 Feb. 5, 2009

Related U.S. Application Data

(60) Provisional application No. 60/952,656, filed on Jul. 30, 2007.

(51) Int. Cl.
*G01R 11/02* (2006.01)
(52) U.S. Cl. ......... 702/117; 702/118; 702/120; 702/182
(58) Field of Classification Search ................ 702/59, 702/84, 117, 118, 120, 181, 182; 324/537; 703/2, 15; 714/738, 744
See application file for complete search history.

(56) References Cited

U.S. PATENT DOCUMENTS

| | | | |
|---|---|---|---|
| 5,493,504 A | 2/1996 | Minato | 364/488 |
| 5,515,384 A | 5/1996 | Horton, III | 371/22.4 |
| 5,570,376 A | 10/1996 | Kunda et al. | 371/25.1 |
| 5,640,403 A | 6/1997 | Ishiyama et al. | 371/26 |
| 6,301,685 B1 | 10/2001 | Shigeta | 714/799 |
| 6,308,293 B1 | 10/2001 | Shimono | 714/741 |
| 6,397,362 B1 | 5/2002 | Ishiyama | 714/724 |
| 6,401,227 B1 | 6/2002 | Yasue et al. | 714/744 |
| 6,536,007 B1 | 3/2003 | Venkataraman | 714/724 |
| 6,721,914 B2 | 4/2004 | Bartenstein et al. | 714/734 |
| 6,836,856 B2 * | 12/2004 | Blanton | 714/25 |
| 6,880,136 B2 | 4/2005 | Huisman et al. | 716/4 |
| 6,970,815 B1 * | 11/2005 | Bombal et al. | 703/15 |
| 7,017,095 B2 | 3/2006 | Forlenza et al. | 714/738 |
| 7,089,474 B2 | 8/2006 | Burdine et al. | 714/738 |
| 7,120,829 B2 | 10/2006 | Shigeta | 714/25 |
| 7,231,571 B2 * | 6/2007 | Buckley, Jr. | 714/738 |
| 7,240,316 B2 * | 7/2007 | Regnier | 716/11 |

* cited by examiner

*Primary Examiner* — Eliseo Ramos Feliciano
*Assistant Examiner* — Felix E Suarez
(74) *Attorney, Agent, or Firm* — Kelly J. Kubasta; Klemchuk Kubasta LLP

(57) ABSTRACT

A method for testing VLSI circuits comprises a two-pass diagnostic method for testing a circuit wherein a first pass comprises a conventional test flow wherein an ATPG tool generates a set of test patterns and identifies possible faulty nets within the circuit. A second pass focuses on a designated critical subset of the circuit extracted using a method for extracting a subset for failure diagnosis of the tested circuit. A second pass utilizes an extraction algorithm which extracts one or more critical subsets of the circuit in order to obtain more accurate failure diagnosis.

4 Claims, 4 Drawing Sheets

Critical Circuit Subset Extraction Flowchart

Figure 1: Flowchart of the two-pass fault diagnosis method
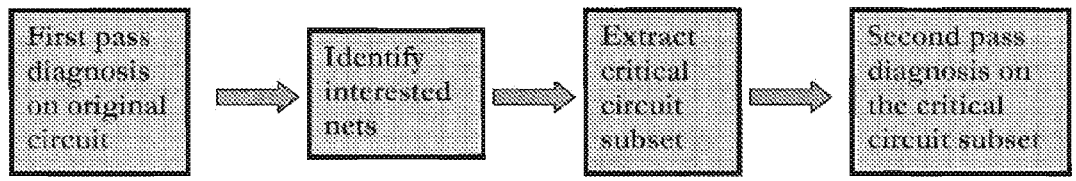
Figure 2: Critical Circuit Subset Extraction Flowchart
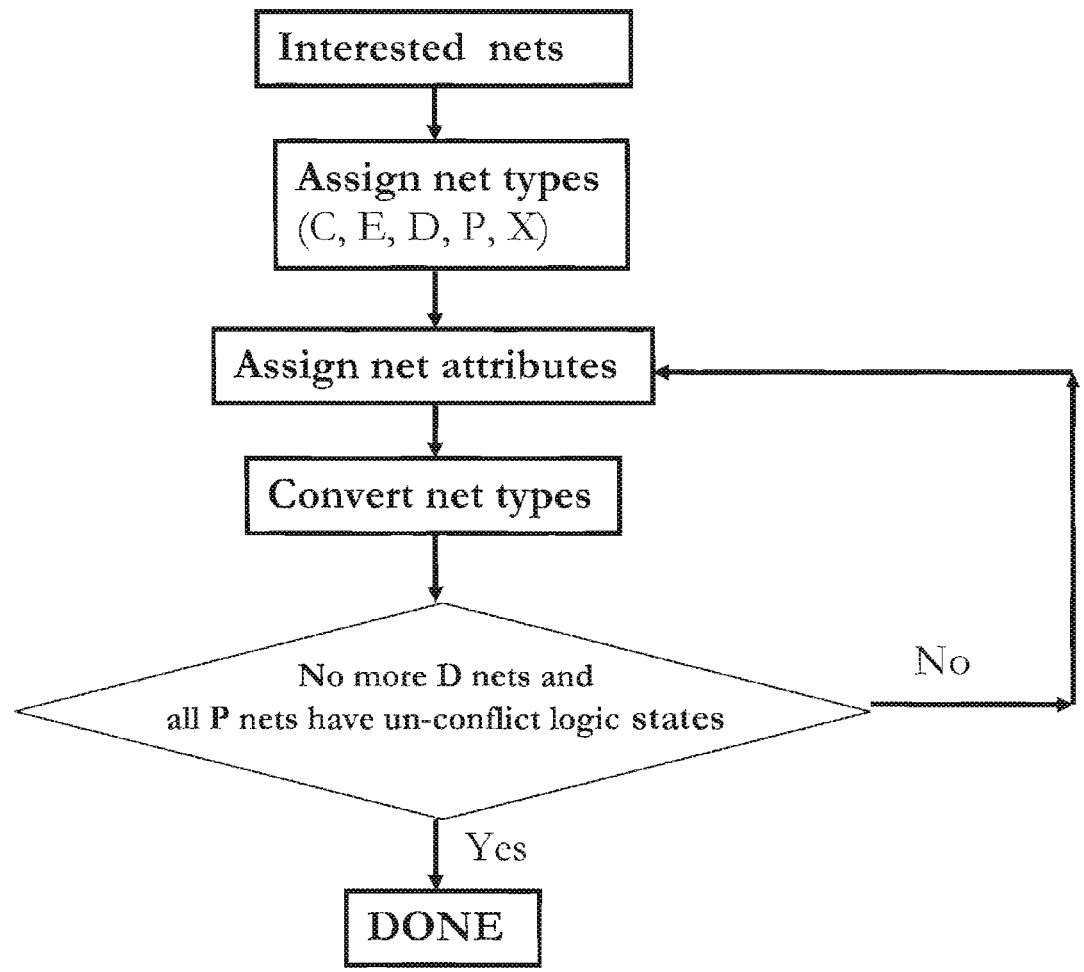

Figure 3: E Net Forward Assignment
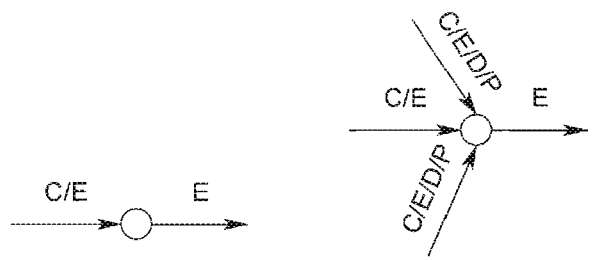
Figure 4: D Net Assignment
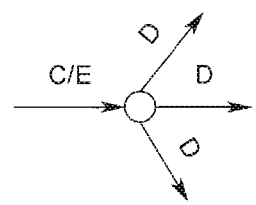
Figure 5: D Net Propagation
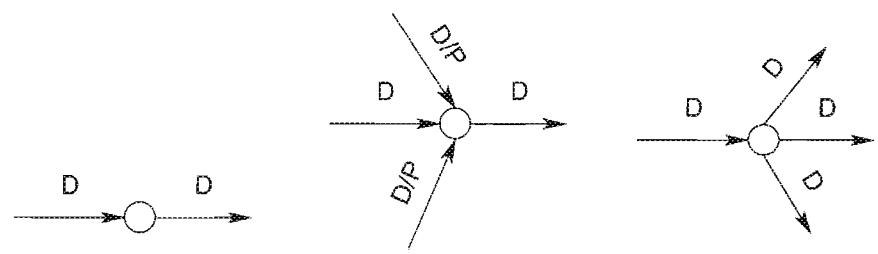

Figure 6: E Net Backward Assignment
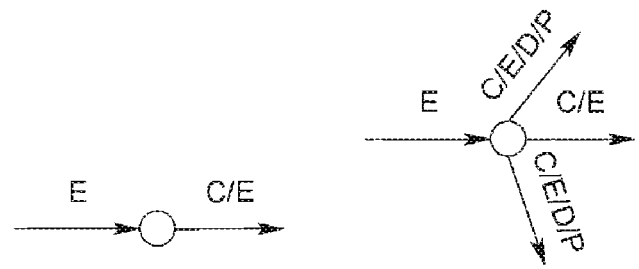
Figure 7: P Net Assignment
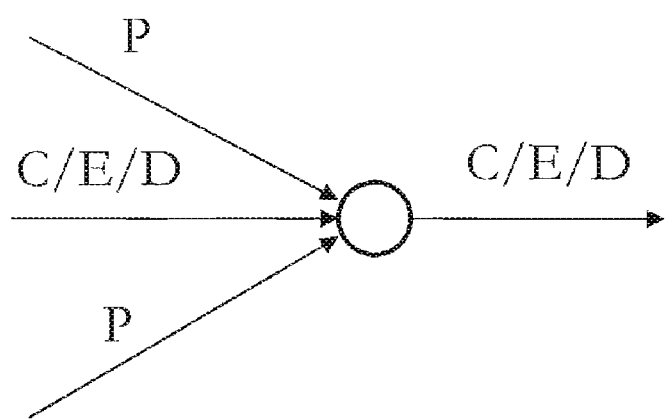
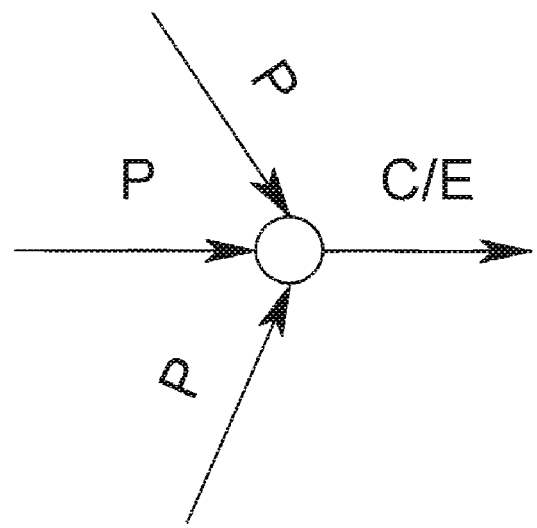

Figure 8: P Net Propagation
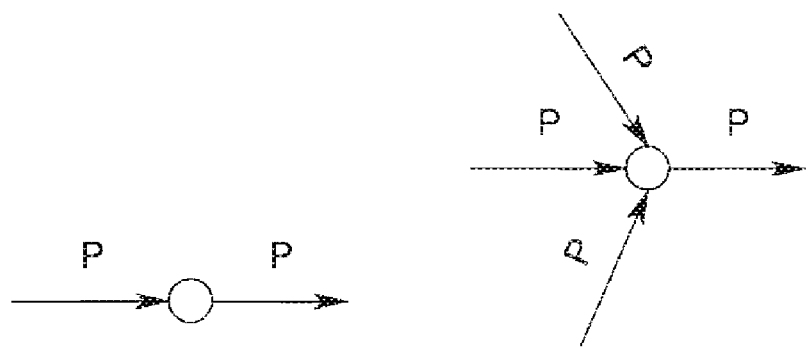

METHOD OF DIGITAL EXTRACTION FOR ACCURATE FAILURE DIAGNOSIS

CROSS-REFERENCE TO RELATED APPLICATION

Applicant claims priority based on provisional patent application Ser. No. 60/952,656 filed Jul. 30, 2007, the entire content of which is incorporated herein by reference.

TECHNICAL FIELD

This invention relates generally to methods for testing digital circuits and more particularly to a method for extracting a subset from a digital circuit for more accurate failure diagnosis.

BACKGROUND AND SUMMARY OF THE INVENTION

Timely and accurate identification of root causes for a faulty chip is important in yield improvement, debug of new device silicon, and failure analysis of customer returns. Traditional failure analysis of faulty chips comprises two processes, electrical failure analysis and physical failure analysis. Electrical failure analysis localizes and examines the faulty electrical behavior by varying test conditions such as supply voltage, frequency, temperature etc. Physical failure analysis acquires physical defect images and/or measures physical dimensions such as gate lengths, metal pitches, etc through instruments such as a Transmission Electronic Microscope (TEM) and a Scanning Electronic Microscope (SEM). As silicon technology advances the silicon dimension becomes smaller and smaller resulting in more difficult defect searching during physical failure analysis. Small defects that previously were not harmful to device operations become deadly defects. Searching such smaller defects in physical failure analysis requires the electrical failure analysis provide better fault diagnostic resolution.

The present invention comprises a method for performing failure diagnostics of a circuit which overcomes the foregoing difficulties which have long since characterized the prior art. In accordance with the broader aspects of the invention a method for testing VLSI circuits comprises a two-pass diagnostic method for testing a VLSI circuit wherein a first pass comprises a conventional test flow in which an ATPG tool generates a set or test patterns and identifies possible faulty nets within the circuit and a second pass comprises extracting one or more critical subsets from the original circuit utilizing an extraction algorithm in order to obtain more accurate failure diagnosis than has been previously available using other testing methods known in the art.

In accordance with more specific aspects of the invention, an Automatic Test Pattern Generation (ATPG) tool first generates test patterns for an original circuit. The original circuit is tested according to the generated test patterns and output data is collected. Once the output data is collected fault diagnosis is performed by using fault diagnosis capability of an ATPG tool. The fault diagnosis generates a list of likely faulty nets. The likely faulty nets are then used as the interested nets for extraction of the critical circuit subset. Once the critical circuit subset is extracted, the ATPG tool can generate more thorough test patterns on the much smaller extracted subset. The test patterns are mapped back to the original circuit for testing by the ATPG. Output data from the ATPG test can be collected and a more accurate fault diagnosis can be performed. If the fault diagnostic resolution is not satisfied, the process can be repeated until the desired resolution is reached. The likely faulty nets generated in previous runs can be used as the interested nets for the circuit subset extraction in subsequent runs.

The extracted critical subset contains all nets of interest which include all possible faulty nets. The subset maintains accessibility to the interested nets thereby maintaining the capability of asserting and observing the logic states of the interested nets. The critical subset significantly reduces the circuit size comparing to the original circuit. There are several advantages to working on a smaller circuit subset than on the original circuit. First, the ATPG tool generates test patterns for a small circuit much faster than for a larger circuit. Second, the test patterns for the small circuit can be much more thorough thereby improving the fault coverage and the fault diagnostic resolution. Finally, the test time is much faster relative to a test time for a larger circuit, enabling re-testing of the critical subset as needed to vary parameters such as supply voltages, frequency, temperature, etc.

The extraction algorithm comprises an extensive set of rules by which unnecessary circuit elements can be systematically eliminated from the "subset" circuit. For each possible input and output of a likely faulty net the algorithm selects an optimal path within a critical "subset circuit" of the circuit and passivates all other possible paths such that the inputs and outputs of the pacified paths are insensitive to inputs. As used herein the term "passivate" means to make a component neutral to inputs or outputs and to neighboring components. If any path cannot be passivated then that path is also included in the subset circuit for testing. The subset circuit focuses on specific local areas where the most probable faults lie. The subset includes all faulty candidate nets and all possible surrounding circuitry traced up to primary inputs (PI), primary outputs (PO), & scan cells. The subset therefore significantly reduces size of circuit to be scanned. The subset circuit is extracted from the original circuit, so no changes are required to existing ATPG tools or diagnosis flows.

BRIEF DESCRIPTION OF THE DRAWINGS

A more complete understanding of the present invention may be had by reference to the following Detailed Description when taken in connection with the accompanying Drawings, wherein:

FIG. 1 is a flowchart illustrating a two-pass diagnostic method comprising one aspect of the present invention;

FIG. 2 is a flowchart illustrating extraction of a critical circuit subset according to an extraction algorithm comprising one aspect of the present invention;

FIG. 3 is an illustration of E net forward assignment according to the extraction algorithm of the present invention;

FIG. 4 is an illustration of D net assignment according to the extraction algorithm of the present invention;

FIG. 5 is an illustration of D net propagation according to the extraction algorithm of the present invention;

FIG. 6 is an illustration of E net backward assignment according to the extraction algorithm of the present invention;

FIG. 7 is an illustration of P net assignment according to the extraction algorithm of the present invention; and FIG. 8 is an illustration of P net propagation according to the extraction algorithm of the present invention;

DETAILED DESCRIPTION

Referring now to FIG. 1 there is shown a two-pass fault diagnostic method comprising one embodiment of the present invention. A first pass comprises testing an original circuit according to test patterns generated by an ATPG tool and collecting output data and a second pass comprises testing a critical subset extracted from the original circuit according to an extraction algorithm comprising one aspect of the present invention. First, the original circuit is tested and output data is collected. Once the output data is collected fault diagnosis is performed on the original circuit utilizing the ATPG tool. The fault diagnosis generates a list of likely faulty nets. The likely faulty nets are then used as the interested nets for extraction of the critical circuit subset. Extraction of a critical subset of the original circuit is thereafter performed according to an extraction algorithm comprising one aspect of the present invention.

For any digital VLSI circuit with full scan chain implementation, a critical circuit subset can be extracted using the extraction algorithm comprising one aspect of the invention. The extracted critical circuit subset has three characteristics. (1) The extracted subset contains all interested nets and assumes that all likely faulty nets are included among the interested nets so that all other nets can be assumed to be functional. (2) The extracted circuit subset maintains the accessibility to the interested nets, that is, it maintains the capability of asserting and observing the logic states of the interested nets. There is at least one unique input path and one unique output path for each interested net in order to maintain the accessibility. (3) The extracted critical circuit subset significantly reduces the circuit size, enabling minimization of circuit size while maintaining accessibility of the interested nets.

When the faulty nets are identified, the critical subset may thereafter be extracted according to the extraction algorithm, which assigns net types to all nets in the circuit. Nets of interest are assigned type "C." Nets that extend the interested nets to inputs and outputs for their accessibility are assigned types "E." Nets that allow C and E nets passing gates without interfering other input nets of the gates are called P nets. Each P net has a fixed logic state assigned. All other nets in the circuit besides C, E, and P nets are assigned type X nets, meaning "do not care nets," which can be ignored during subsequent diagnostics and testing. The critical circuit subset therefore contains only C, E, and P nets.

ATPG test patterns can thereafter be generated for the critical circuit subset and then mapped back to the original circuit. During a test operation, only C and E net logic states are purposely toggled. The P nets are fixed with their assigned logic values. After running the test operation, output data can be collected and the fault diagnosis can be performed. If the diagnostic resolution is not satisfied, the method presented in the invention can be used repeatedly. The likely faulty nets generated in the previous pass can be used as the interested nets for the subsequent circuit extraction and diagnosis.

DEFINITIONS AND TERMINOLOGY

Pseudo Primary Input/Output

The pseudo primary inputs and outputs are referred to as outputs and inputs of scan cells. Scan chain technique is frequently and commonly used in the advanced digital VLSI circuit designs. Scan chain technique comprises chaining the registers and latches within the circuitry together in series. Each register/latch becomes a scan cell in a scan chain. The scan cell logic states can be set and observed through an appropriate procedure via the three special ports: scan in, scan out, and scan enable. With the help of full scan chain technique, a sequential circuitry can become a pure combinational circuitry. The registers or latches become scan cells whose inputs and outputs become the pseudo primary outputs and inputs for the combinational circuitry.

Nodes and Nets

All circuits have only two types of entities: gates and nets. Accordingly, each circuit can be considered as a large data structure which is nothing but a collection of nodes and nets. A node can be a gate node, a stern node, or an input/output node. A gate node generally consists of inputs coming into the node and one output generated out of the node. A stem node has one input but multiple outputs or branches. There are two types of input/output nodes: primary input/output nodes and pseudo primary input/output nodes. The primary input/output nodes are the regular circuitry input/output ports. The pseudo primary inputs/outputs are referred to as the scan cell outputs and inputs.

Upstream and Downstream Nets

Upstream and downstream nets are referred to as the adjacent nets along the signal flow direction. Upstream nets are the nets from the input side and downstream nets are the nets from the output side.

Net Types

When extracting the critical circuit subset, each net in the original circuit is assigned one of the following net types:
a. C—stands for "core" net. Each C net is a net of interest.
b. E—stands for "extended" net. E nets are the nets necessary to extend the C nets into primary or pseudo primary inputs/outputs in order to maintain the capability of asserting and observing the C nets.
c. P—stands for "passivating" nets. When C, E, or D nets pass a gate sharing with other inputs, the other inputs are assigned a fix logic value so that the output of the gate is solely determined by the C, E or D nets. These other inputs are called P nets, the passivating nets.
d. X—stands for "not care" nets, meaning all X nets can be ignored during subsequent testing and failure analysis.
e. D—stands for "to be decided". When a net of the type 'C' or 'E' hits a stem that branches out, there are multiple paths from this net to reach the primary outputs. Initially, a best path is not known so each branch of the stein is assigned a 'D' net type. Eventually, one or more of these paths will be chosen and all nets therein assigned as either E nets or converted to X nets.

Net Attributes

P and D nets each have additional special attributes. The attributes for a P net comprise source, value, and possibility. The attribute for a D nets is difficulty. Each P net source attribute has two values:
'E'—the P net path passivates an E net; and
'D'—the P net path passivates a D net.
A P net value attribute has three possible values:
'0'—the P net should be set at logic 0;
'1'—the P net should be set at logic 1; and
'0&1'—the P net has conflicting logic states.
A P net possibility attribute has five possible values:
'Y'—the P net path logic state can be set without conflicts;
'N'—the P net path intersects with E net at a stem output;
'CE'—the P net path logic state has conflicts with P net paths that passivate E nets;
'CD'—the P net path logic state has conflicts with P net paths that passivate D nets; and
'C'—the P net has value attribute '0&1'.
D net difficulty attribute has six possible values:
'0'—the D net path has no intersection with, other C, E, or D net paths and all passivated P nets have possibility attribute 'Y';

'1'—the D net path has no intersection with other C, E, or D net paths and at least one of the passivated P nets has possibility attribute 'CD' but none have possibility attribute 'CE' or 'N';

'2'—the D net path has no intersection with other C, E, or D net paths and at least one of the passivated P nets has possibility attribute 'CE' but none have possibility attribute 'N';

'3'—the D net path has no intersection with other C, E, or D net paths and at least one of the passivated P nets has possibility attribute 'N';

'4'—the D net path has intersections with other D net paths and have no intersections with other C or E net paths; and '5'—the D net path has intersections with other C or E net paths.

Path

A path is defined as a sequence of nets of the same type connecting each other in the order following the direction of signal flows.

Extraction Algorithm Details

For a given set of interested nets, the critical circuit extraction is as illustrated in FIG. 2. A first step comprises assigning a net type for each net. There are 5 net types: C, E, X, D, and P. C nets are for the interested nets. E nets are the extension of C nets to the inputs and outputs. C and E nets' logic states can be purposely toggled during test operation. X nets are "don't care" nets, which can thereafter be ignored in subsequent testing operations. D nets are the temporary nets which will eventually be converted to either E nets or X nets. P nets will have fixed logic states during test operation. Once the logic values are assigned to each P net, the P nets thereafter allow C or E net passing gates without interfering with nets other than C or F nets.

Once the net type is assigned, a second step comprises assigning net attributes to all D and P nets. Each D net is assigned a "difficulty" attribute which is used to determine which D nets to convert to E nets and which D nets to convert to X nets. Each P net has three attributes: "source", "possibility", and "value". Source and possibility attributes help determine which P nets to convert to E nets and value attributes indicate which logic value to be set for each P nets.

After assigning net attributes, a net type conversion process begins to convert P and D nets to either E or X nets in order to maintain accessibility to the interested nets while minimizing the circuit size of the critical subset. The net type conversion process comprises a repeat process of converting net types and assigning net attributes. When some nets are converted, other net attributes need to be reassigned accordingly. More nets can thereafter be converted based on the newly assigned attributes. The net type conversion process is repeated until all D nets are converted to either E or X nets and all remaining P nets have possibility attribute "Y".

The procedures and criteria for assigning net types, net attributes, and converting net types are detailed according to the following rules:

Procedure for Assigning Net Types a) All interested nets are assigned as type C nets;
b) Any unassigned nets that are the output nets of gates whose input nets contain C or E nets are assigned as type E nets as illustrated in FIG. 3;
c) Any unassigned nets that are multiple output nets of a stem whose input net is C or E net are assigned as type D nets as illustrated in FIG. 4;
d) Any unassigned nets for which the upstream nets contain D nets are assigned as type D nets as illustrated in FIG. 5;
e) Any unassigned net that is the sole input of a stem or a gate whose outputs contain C or E nets are assigned as type E nets as illustrated in FIG. 6;
f) Any unassigned nets that are input nets of gates whose outputs are C, E, or D nets are assigned as type P nets as illustrated in FIG. 7;
g) Any unassigned nets whose downstream nets contain P nets are assigned as type P nets as illustrated FIG. 8;
h) Any remaining unassigned nets are assigned as type X nets.

Procedure for Assigning Net Attributes a) Attributes for P nets are assigned according to the following procedure:
  i) Assign source attribute 'E' to any P nets which are inputs of gates whose outputs are either C or E nets;
  ii) Assign source attribute 'D' to any P nets which are inputs of gates whose outputs are D nets;
  iii) Assign source attribute 'E' to any P nets with downstream P nets having source attribute 'E';
  iv) Assign source attribute 'D' to any P nets with downstream P nets having source attribute 'D';
  v) Assign value attribute '1' to P nets which are inputs of AND or NAND gates whose outputs are C, E, or D nets;
  vi) Assign value attribute '0' to P nets which are inputs of OR or NOR gates whose outputs are C, F, or D nets;
  vii) For P nets that are inputs of gates whose outputs are P nets, assign value attributes so that when the input P nets' logic states are set as the input P net value attributes, the output P nets are at the logic states as indicated by the output P net value attributes;
  viii) For any P net that is an input of a stem, assign the same value attribute as that of the output P nets if all output P nets have the same value attribute; if output P nets have different value attributes, assign the stem input P net value attribute '0&1';
  ix) Assign value attribute '0&1' to any P nets with downstream P net value attributes of '0&1';
  x) Assign possibility attribute 'N' to P nets which are stem outputs and the corresponding stem inputs are E nets;
  xi) Assign possibility attribute 'CE' to any P net which (1) is an output of a stem whose input P net has a value attribute of '0&1' and (2) at least one of the stem output P nets with source attribute 'E' has a value attribute different from its own value attribute;
  xii) Assign possibility attribute 'CD' to any P net which (1) is an outputs of a stem whose input P nets have value attribute '0&1' and (2) all stem output P nets that have different value attributes have source attribute 'D';
  xiii) Assign possibility attribute 'N' to P nets with upstream P nets having possibility attribute 'N';
  xiv) Assign possibility attribute 'CE' to P nets with upstream P nets having possibility attribute 'CE' and with possibility attributes which have not been assigned in any of the previous steps (i) through (xii);
  xv) Assign possibility attribute 'CD' to P nets with upstream P nets having possibility attribute 'CD' and with possibility attributes which have not been assigned in any of the previous steps (i) through (xiv);
  xvi) Assign possibility attribute 'C' to P nets having a value attribute of '0&1' and with possibility attributes which have not been assigned in any of the previous steps (i) through (xv);

xvii) Assign possibility attribute 'Y' to any P nets whose possibility attributes have not been assigned in any of the previous steps (i) through (xvi).
b) Net attributes of D nets are assigned according to the following procedure;
   i) Assign difficulty attribute '0' to any D nets having paths which can reach primary or pseudo primary outputs without intersecting any other C/E/D net paths at gates and if all passivating P nets if any, along the paths have possibility attribute "Y";
   ii) Assign difficulty attribute to any D nets having paths which can reach primary or pseudo primary outputs without intersecting any other C/E/D paths at gates and at least one of said D net's passivated P nets has possibility attribute 'CD' but none having possibility attribute 'CE';
   iii) Assign difficulty attribute '2' to any D nets having paths which can reach primary or pseudo primary outputs without intersecting any C/E/D paths at gates and at least one of said D net's passivated P nets has possibility attribute 'CE';
   iv) Assign difficulty attribute '3' to any D nets having paths which can reach primary or pseudo primary outputs without intersecting any C/E/D paths at gates and at least one of said D net's passivated P nets has possibility attribute 'N';
   v) Assign difficulty attribute '4' to any D nets having paths which intersect with other D net paths at gates, but do not intersect with C or E nets at gates;
   vi) Assign difficulty attribute '5' to any D nets having paths which intersect with other C' or E net paths at gates.

Procedure for Converting Net Type

Net types are converted according to the following procedure:
a) Convert D nets with difficulty attribute of '5' into E nets;
b) Re-assign net attributes according to the procedures for assigning net attributes;
c) Repeat steps a) and b) until there are no remaining D nets with difficulty attribute of '5';
d) For any stem at which the input is a C or E net and some outputs are D nets, among which there is at least one D net path with difficulty attribute '0', do the following conversion:
   i. Convert the D net path that least intersects with P nets among, the paths of D nets having a difficulty attribute of '0' into E net path;
   ii. Convert all D net paths at the stem output with a difficulty attribute of '4' into P nets;
   iii. Convert all other D net paths at the stem output along with said D nets' passivated P net paths into X net paths;
e) Re-assign net attributes as described in the procedures for assigning net attributes;
f) Repeat steps d) and e) until there are no remaining D net paths with a difficulty attribute of '0';
g) For any stem at which the input is a C or E net and some outputs are D nets among which at least one D net path has difficulty attribute value of '1', do the following conversion:
   i. Convert the D net path that least intersects with P nets among the difficulty attribute '1' D net paths into an E net path;
   ii. Convert all D net paths at the stem output with a difficulty attribute of '4' into P nets,
   iii. Convert all other D net paths at the stem output along with said D nets' passivated P net paths into X net paths;
h) Re-assign net attributes as described in the procedures for assigning net attributes;
i) Repeat steps d) through h) until all D net paths have difficulty attributes larger than 1;
j) For any stem at which the input is a C or E net and some outputs are D nets among which there are at least one D net path with a difficulty attribute of '2', do the following conversion:
   i. Convert the D net path that least intersects with P nets among the paths of D nets having a difficulty attribute of '2' into an E net path;
   ii. Convert all D net paths at the stem output having a difficulty attribute of '4' into P nets;
   iii. Convert all other D net paths at the stem output along with said D nets' passivated P net paths into X net paths;
k) Re-assign net attributes as described in the procedures for assigning net attributes;
l) Repeat steps d) through k) until all D net paths have difficulty attributes larger than 2;
m) For any stem at which the input is a C or E net and some outputs are D nets among which at least one D net path has a difficulty attribute value of '3', do the following conversion:
   i. Convert the D net path that least intersects with P nets among the paths of D nets having difficulty attribute '3' into an E net path;
   ii. Convert all difficulty attribute '4' D net paths at the stem output into P nets;
   iii. Convert all other D net paths at the stem output along with said D nets' passivated P net paths into X net paths;
n) Re-assign net attributes as described in the procedures of assigning net attributes;
o) Repeat steps d) through n) until all D net paths have difficulty attributes larger than 3;
p) Convert all remaining D nets into E nets;
q) Re-assign net attributes as described in the procedures for assigning net attributes;
r) For any gate at which all inputs are P nets and the output is C or E net, if there is at least one input P net having possibility attribute 'Y', choose the P net path that intersects the least number of other P net paths among the possibility attribute 'Y' P net paths and convert it into E net path;
s) Re-assign net attributes as described in the procedures for assigning net attributes;
t) Convert all P nets that have possibility attribute other than 'Y' into E nets.

Performance of the above extraction algorithm results in extracting a reduced-size combinational "subset" circuit from the original circuit comprising only core and extended nets. Fault diagnosis can thereafter be performed on the extracted "subset" circuit in a more timely and accurate manner than diagnosing the entire original circuit. A development or production engineer can therefore analyze results of said fault diagnosis and determine corrective actions needed, if any, to either the design of the circuit and/or a production process utilized in fabricating the circuit.

Although preferred embodiments of the invention have been illustrated in the accompanying Drawings and described in the foregoing Detailed Description, it will be understood that the invention is not limited to the embodiments disclosed, but is capable of numerous rearrangements, modifications, and substitutions of parts and elements without departing from the spirit of the invention.

The invention claimed is:

1. A method for testing Very Large Scale Integration circuits, the method comprising:
   generating a set of test patterns for an original circuit;
   running a test on the original circuit utilizing the generated test patterns and identifying faulty nets within the circuit;
   providing an extraction algorithm comprising the steps of:
   a) providing a synthesized, full scan netlist of the original circuit;
   b) providing a possible candidate fault list which contains each existing fault within the circuit, each existing fault having a gate name and position;
   c) assigning net types to all nets within the original circuit, the net types selected from the group consisting of Core (C), extended (E), to be decided (D), can be passivated (P), and can be ignored (X);
   d) assigning net attributes for all type (P) and (D) nets;
   e) converting assigned type (P) and (D) nets to either type (E) or (X) nets;
   f) re-assigning net attributes to converted nets; and
   g) repeating steps e) and f) until all type (D) nets are converted to either type (E) or (X) nets and all type (P) nets have net possibility attributes indicating that a net path logic can be set without conflicts (Y);
   extracting a reduced circuit from the defined subset according to the provided extraction algorithm, the reduced circuit comprising at least one complete path from one faulty site of one faulty net to the primary and pseudo primary inputs; and
   passing the reduced circuit through a pattern generation test tool for fault diagnosis of the one faulty net within the reduced circuit;
   wherein the net types are assigned to all nets within the original circuit according to a method comprising the steps of:
   a) assigning net type (C) to all interested nets;
   b) assigning net type (E) to any unassigned nets that are the output nets of gates whose input nets contain (C) or (E) nets;
   c) assigning net type (D) to any unassigned nets that are multiple output nets of a stem whose input net is (C) or (E) net;
   d) assigning net type (D) to any unassigned nets for which the net's upstream nets contain (D) nets;
   e) assigning net type (E) to any unassigned net that is the sole input of a stem or a gate whose outputs contain (C) or (E) nets;
   f) assigning net type (P) to any unassigned nets that are input nets of gates whose outputs are (C), (E), or (D) nets;
   g) assigning net type (P) to any unassigned nets whose downstream nets contain (P) nets; and
   h) assigning net type (X) to any remaining unassigned nets.

2. A method for testing Very Large Scale Integration circuits, the method comprising:
   generating a set of test patterns for an original circuit;
   running a test on the original circuit utilizing the generated test patterns and identifying faulty nets within the circuit;
   providing an extraction algorithm comprising the steps of:
   a) providing a synthesized, full scan netlist of the original circuit
   b) providing a possible candidate fault list which contains each existing fault within the circuit, each existing fault having a gate name and position;
   c) assigning net types to all nets within the original circuit, the net types selected from the group consisting of Core (C), extended (E), to be decided (D), can be passivated (P), and can be ignored (X);
   d) assigning net attributes for all type (P) and (D) nets;
   e) converting assigned type (P) and (D) nets to either type (E) or (X) nets;
   f) re-assigning net attributes to converted nets; and
   g) repeating steps e) and f) until all type (D) nets are converted to either type (E) or (X) nets and all type (P) nets have net possibility attributes indicating that a net path logic can be set without conflicts (Y);
   extracting a reduced circuit from the defined subset according to the provided extraction algorithm, the reduced circuit comprising at least one complete path from one faulty site of one faulty net to the primary and pseudo primary inputs; and
   passing the reduced circuit through a pattern generation test tool for fault diagnosis of the one faulty net within the reduced circuit;
   wherein the net attributes are assigned to all type (P) nets according to a method comprising the steps of:
   a) assigning source attribute (E) to any (P) nets which are inputs of gates whose outputs are either (C) or (E) nets;
   b) assigning source attribute (D) to any (P) nets which are inputs of gates whose outputs are (D) nets;
   c) assigning source attribute (E) to any (P) nets with downstream (P) nets having source attribute (E);
   d) assigning source attribute (D) to any (P) nets with downstream (P) nets having source attribute (D);
   e) assigning value attribute one (1) to (P) nets which are inputs of AND or NAND gates whose outputs are (C), (E), or (D) nets;
   f) assigning value attribute zero (0) to (P) nets which are inputs of OR or NOR gates whose outputs are (C), (E), or (D) nets;
   g) for (P) nets that are inputs of gates whose outputs are (P) nets, assigning value attributes so that when the input (P) nets' logic states are set as the input (P) net value attributes, the output (P) nets are at the logic states as indicated by the output (P) net value attributes;
   h) for any (P) net that is an input of a stem, assigning the same value attribute as that of the output (P) nets if all output (P) nets have the same value attribute; if output (P) nets have different value attributes, assigning the stem input (P) net value attribute zero (0) and one (1);
   i) assigning value attribute zero (0) and one (1) to any (P) nets with downstream (P) net value attributes of zero (0) and one (1);
   j) assigning possibility attribute (N) to (P) nets which are stem outputs and the corresponding stem inputs are (E) nets;
   k) assigning possibility attribute (CE) to any (P) net which (1) is an output of a stem whose input (P) net has a value attribute of zero (0) and one (1) and (2) at least one of the stem output (P) nets with source attribute (E) has a value attribute different from its own value attribute;
   l) assigning possibility attribute (CD) to any (P) net which (1) is an output of a stem whose input (P) nets have value attribute zero (0) and one (1), and (2) all stem output (P) nets that have different value attributes have source attribute (D);
   m) assigning possibility attribute (N) to (P) nets with upstream (P) nets having possibility attribute (N);

n) assigning possibility attribute (CE) to (P) nets with upstream (P) nets having possibility attribute (CE) and with possibility attributes which have not been assigned in any of the previous steps a) through m);

o) assigning possibility attribute (CD) to (P) nets with upstream (P) nets having possibility attribute (CD) and with possibility attributes which have not been assigned in any of the previous steps a) through n);

p) assigning possibility attribute (C) to (P) nets having a value attribute of zero (0) and one (1) and with possibility attributes which have not been assigned in any of the previous steps a) through o);

q) assigning possibility attribute (Y) to any (P) nets whose possibility attributes have not been assigned in any of the previous steps a) through p).

3. A method for testing Very Large Scale Integration circuits, the method comprising:
generating a set of test patterns for an original circuit;
running a test on the original circuit utilizing the generated test patterns and identifying faulty nets within the circuit;
providing an extraction algorithm comprising the steps of:
a) providing a synthesized, full scan netlist of the original circuit
b) providing a possible candidate fault list which contains each existing fault within the circuit, each existing fault having a gate name and position;
c) assigning net types to all nets within the original circuit, the net types selected from the group consisting of Core (C), extended (E), to be decided (D), can be passivated (P), and can be ignored (X);
d) assigning net attributes for all type (P) and (D) nets;
e) converting assigned type (P) and (D) nets to either type (E) or (X) nets;
f) re-assigning net attributes to converted nets; and
g) repeating steps e) and f) until all type (D) nets are converted to either type (E)
or (X) nets and all type (P) nets have net possibility attributes indicating that a net path logic can be set without conflicts (Y);
extracting a reduced circuit from the defined subset according to the provided extraction algorithm, the reduced circuit comprising at least one complete path from one faulty site of one faulty net to the primary and pseudo primary inputs; and
passing the reduced circuit through a pattern generation test tool for fault diagnosis of the one faulty net within the reduced circuit;
wherein the net attributes are assigned to all type (D) nets according to a method comprising the steps of:
a) assigning difficulty attribute zero (0) to any (D) nets having paths which can reach primary or pseudo primary outputs without intersecting any other (C/E/D) net paths at gates and if all passivating (P) nets, if any, along the paths have possibility attribute (Y);
b) assigning difficulty attribute one (1) to any (D) nets having paths which can reach primary or pseudo primary outputs without intersecting any other (C/E/D) paths at gates and at least one of said (D) net's passivated (P) nets has possibility attribute (CD) but none having possibility attribute (CE);
c) assigning difficulty attribute two (2) to any (D) nets having paths which can reach primary or pseudo primary outputs without intersecting any (C/E/D) paths at gates and at least one of said (D) net's passivated (P) nets has possibility attribute (CE);

d) assigning difficulty attribute three (3) to any (D) nets having paths which can reach primary or pseudo primary outputs without intersecting any (C/E/D) paths at gates and at least one of said (D) net's passivated (P) nets has possibility attribute (N);
e) assigning difficulty attribute four (4) to any (D) nets having paths which intersect with other (D) net paths at gates, but do not intersect with (C) or (E) nets at gates; and
f) assigning difficulty attribute five (5) to any (D) nets having paths which intersect with other (C) or (E) net paths at gates.

4. A method for testing Very Large Scale Integration circuits, the method comprising:
generating a set of test patterns for an original circuit;
running a test on the original circuit utilizing the generated test patterns and identifying faulty nets within the circuit;
providing an extraction algorithm comprising the steps of:
a) providing a synthesized, full scan netlist of the original circuit;
b) providing a possible candidate fault list which contains each existing fault within the circuit, each existing fault having a gate name and position;
c) assigning net types to all nets within the original circuit, the net types selected from the group consisting of Core (C), extended (E), to be decided (D), can be passivated (P), and can be ignored (X);
d) assigning net attributes for all type (P) and (D) nets;
e) converting assigned type (P) and (D) nets to either type (E) or (X) nets;
f) re-assigning net attributes to converted nets; and
g) repeating steps e) and f) until all type (D) nets are converted to either type (E)
or (X) nets and all type (P) nets have net possibility attributes indicating that a net path logic can be set without conflicts (Y);
extracting a reduced circuit from the defined subset according to the provided extraction algorithm, the reduced circuit comprising at least one complete path from one faulty site of one faulty net to the primary and pseudo primary inputs; and
passing the reduced circuit through a pattern generation test tool for fault diagnosis of the one faulty net within the reduced circuit;
wherein the nets are converted into a different net type according to a method comprising the steps of:
a) converting (D) nets with difficulty attribute of five (5) into (E) nets;
b) re-assigning net attributes according to a method for assigning net attributes;
c) repeating steps a) and b) until there are no remaining (D) nets with difficulty attribute of five (5);
d) converting any stem at which the input is a (C) or (E) net and some outputs are (D) nets, among which there is at least one (D) net path with difficulty attribute zero (0) according to a first conversion procedure comprising the steps of:
i. converting the (D) net path that least intersects with (P) nets among the paths of (D) nets having a difficulty attribute of zero (0) into (E) net path;
ii. converting all (D) net paths at the stem output with a difficulty attribute of four (4) into (P) nets; and
iii. converting all other remaining (D) net paths at the stem output along with said (D) nets' passivated (P) net paths into (X) net paths;

e) re-assigning net attributes as described in the procedures for assigning net attributes;
f) repeating steps d) and e) until there are no remaining (D) net paths with a difficulty attribute of zero (0);
g) converting any stem at which the stem's input is a (C) or (E) net and some outputs are (D) nets among which at least one (D) net path has difficulty attribute value of one (1) according to a second conversion procedure comprising the steps of:
  i. converting the (D) net path that least intersects with (P) nets among the difficulty attribute one (1) (D) net paths into an (E) net path;
  ii. converting all (D) net paths at the stem output with a difficulty attribute of four (4) into (P) nets;
  iii. converting all other (D) net paths at the stem output along with said (D) nets' passivated (P) net paths into (X) net paths;
h) re-assigning net attributes as described in the procedures for assigning net attributes;
i) repeating steps d) through h) until all (D) net paths have difficulty attributes larger than one (1);
j) converting any stem at which the stem's input is a (C) or (E) net and some outputs are (D) nets among which there are at least one (D) net path with a difficulty attribute of two (2) according to a third conversion procedure comprising the steps:
  i. converting the (D) net path that least intersects with (P) nets among the paths of (D) nets having a difficulty attribute of two (2) into an (E) net path;
  ii. converting all (D) net paths at the stem output having a difficulty attribute of four (4) into (P) nets; and
  iii. converting all other (D) net paths at the stem output along with said (D) nets' passivated (P) net paths into (X) net paths;
k) re-assigning net attributes as described in the procedures for assigning net attributes;
l) repeating steps d) through k) until all (D) net paths have difficulty attributes larger than two (2);
m) converting any stem at which the input is a (C) or (E) net and some outputs are (D) nets among which at least one (D) net path has a difficulty attribute value of three (3) according to a fourth conversion procedure comprising the steps of:
  i. converting the (D) net path that least intersects with (P) nets among the paths of (D) nets having difficulty attribute three (3) into an (E) net path;
  ii. converting all difficulty attribute four (4) (D) net paths at the stem output into (P) net paths; and
  iii. converting all other remaining (D) net paths at the stem output along with said (D) nets' passivated (P) net paths into (X) net paths;
n) re-assigning net attributes as described in the procedures of for assigning net attributes;
o) repeating steps d) through n) until all (D) net paths have difficulty attributes larger than three (3);
p) converting all (D) nets into (E) nets;
q) re-assigning net attributes as described in the procedures for assigning net attributes;
r) converting any gate at which all inputs are (P) nets and the output is a (C) or (E) net, if there is at least one input (P) net having possibility attribute (Y), choose the (P) net path that intersects the least number of other (P) net paths among the possibility attribute (Y) (P) net paths into an (E) net path;
s) re-assigning net attributes as described in the procedures for assigning net attributes;
t) converting all (P) nets that have possibility attribute other than (Y) into (E) nets.

\* \* \* \* \*